United States Patent [19]

Chan et al.

[11] Patent Number: 4,969,121

[45] Date of Patent: Nov. 6, 1990

[54] PROGRAMMABLE INTEGRATED CIRCUIT LOGIC ARRAY DEVICE HAVING IMPROVED MICROPROCESSOR CONNECTABILITY

[75] Inventors: Yiu-Fai Chan, Saratoga; Chuan-Yung Hung, Cupertino, both of Calif.

[73] Assignee: Altera Corporation, San Jose, Calif.

[21] Appl. No.: 20,556

[22] Filed: Mar. 2, 1987

[51] Int. Cl.⁵ .................... H03K 19/177; G06F 7/38
[52] U.S. Cl. .............................. 364/900; 364/965.77; 364/949; 364/949.2; 364/927.8; 364/948.1; 364/716; 307/465
[58] Field of Search ... 364/200 MS File, 900 MS File, 364/716; 307/465; 357/45, 46

[56] References Cited

U.S. PATENT DOCUMENTS

| | | | |
|---|---|---|---|
| 3,912,947 | 10/1975 | Buchanan | 307/269 |
| 4,124,899 | 11/1978 | Birkner et al. | 364/716 |
| 4,238,833 | 12/1980 | Ghest et al. | 364/760 |
| 4,281,380 | 7/1981 | DeMesa et al. | 364/200 |
| 4,609,986 | 9/1986 | Hartmann et al. | 364/200 |
| 4,617,479 | 10/1986 | Hartmann et al. | 307/465 |
| 4,742,252 | 5/1988 | Agrawal | 307/465 |

FOREIGN PATENT DOCUMENTS

WO86/00165  1/1986  World Int. Prop. O.

OTHER PUBLICATIONS

D. Bursky, "Design Bus Interfaces, Peripherals with Programmable-Logic Chip", *Electronic Design*, Aug. 20, 1987, pp. 50-52, 54.

D. Faria, "High Density EPLD's With Second Generation Architecture Features", 8079 *Electro/86 and Mini/Micro Northeast* 11 (1986) Conference Record, vol. 18, No. 2, pp. 1-14.

D. J. Brain, "EPROM Technology Enhances CMOS PAL Performance", *New Electronics*, vol. 18, No. 4, Feb. 19, 1985, pp. 72-73.

R. F. Hartmann, "CMOS Erasable Programmable Logic Devices TTL Replacement Made Easy", *8079 Electro and Mini/Micro Northeast*, vol. 11, No. 1, Apr. 23-25, 1985, pp. 1-9.

J. C. Leininger, "Universal Logic Module", IBM Technical Disclosure Bulletin, vol. 13, No. 5, Oct. 1970, pp. 1294-1295.

*Primary Examiner*—Gareth D. Shaw
*Assistant Examiner*—Paul Kulik
*Attorney, Agent, or Firm*—Robert R. Jackson

[57] ABSTRACT

A programmable integrated circuit logic array device having one or more of the following features: (1) a bus port for receiving data directly from or making data available directly to an associated microprocessor or other similar device, (2) an internal bus (preferably with internal bus arbitration logic for resolving competing demands for utilization of the bus) for conveying data between the bus port and the logic arrays and/or between the logic arrays themselves, (3) the ability to operate either in an edge-trigger mode (in which controlled functions such as input registers are triggered by the transitional edges of control signals) or in a flow-through mode (in which controlled functions such as input registers are triggered by the states rather than the transitional edges of the control signals), and (4) the ability to operate either in a fast mode (in which timing control signals are applied substantially directly to the elements to be controlled) or in a slow mode (in which timing control signals propagate through the logic arrays rather than being applied directly to the elements to be controlled).

21 Claims, 6 Drawing Sheets

PROGRAMMABLE INTEGRATED CIRCUIT LOGIC ARRAY DEVICE HAVING IMPROVED MICROPROCESSOR CONNECTABILITY

BACKGROUND OF THE INVENTION

This invention relates to programmable integrated circuit logic array devices of the type shown in Birkner et al. U.S. Pat. No. 4,124,899, issued Nov. 7, 1978, Hartmann et al. U.S. Pat. No. 4,609,986, issued Sept. 2, 1986, Hartmann et al. U.S. Pat. No. 4,617,479, issued Oct. 14, 1986, Hartmann et al. U.S. patent application Ser. No. 742,089, filed June 6, 1985, now U.S. Pat. No. 4,713,792, and Veenstra U.S patent application Ser. No. 722,684, filed April 12, 1985, now U.S. Pat. No. 4,677,318, all of incorporated by reference herein, and all of which are hereinafter collectively referred to as "the patent references".

Prior programmable integrated circuit logic array devices have not been readily connectable to microprocessors, especially higher speed microprocessors, for certain functions. Various interface devices have been required in many instances between the microprocessor and the programmable logic array device. Prior programmable logic array devices have also not been able to completely process certain information at the basic microprocessor clock rate. This is especially of concern in relation to applications requiring faster and faster microprocessors.

In view of the foregoing, it is an object of this invention to provide improved programmable integrated circuit logic array devices.

It is a more particular object of this invention to provide programmable integrated circuit logic array devices that are more readily connectable to external microprocessors or other similar external devices.

It is another more particular object of in this invention to provide programmable logic array devices that can process information to a greater degree at the clock rate of a microprocessor.

It is yet another more particular object of this invention to provide programmable logic array devices that are capable of performing more logic functions and are programmable to a greater degree.

SUMMARY OF INVENTION

These and other objects of the invention are accomplished in accordance with the principles of the invention by providing programmable integrated circuit logic array devices having one or more of the following features: (1) a bus port for receiving data directly from or making data available directly to an external microprocessor or other similar external device (hereinafter simply "microprocessor"), (2) an internal bus (preferably with internal bus arbitration logic for resolving competing demands for utilization of the bus) for conveying data between the bus port and the logic arrays and/or between the logic arrays themselves, (3) the ability to operate either in an edge-trigger mode (in which controlled functions such as input registers are triggered by the transitional edges of control signals) or in a flow-through mode (in which controlled functions such as input registers are triggered by the logical states rather than the transitional edges of the control signals), and (4) the ability to operate either in a fast mode (in which timing control signals are applied substantially directly to the elements to be controlled) or in a slow mode (in which timing signals propagate through the logic arrays rather than being applied directly to the elements to be controlled).

Further features of the invention, its nature and various advantages will be more apparent from the accompanying drawings and the following detailed description of the invention.

DETAILED DESCRIPTION OF THE INVENTION

Figure 1:
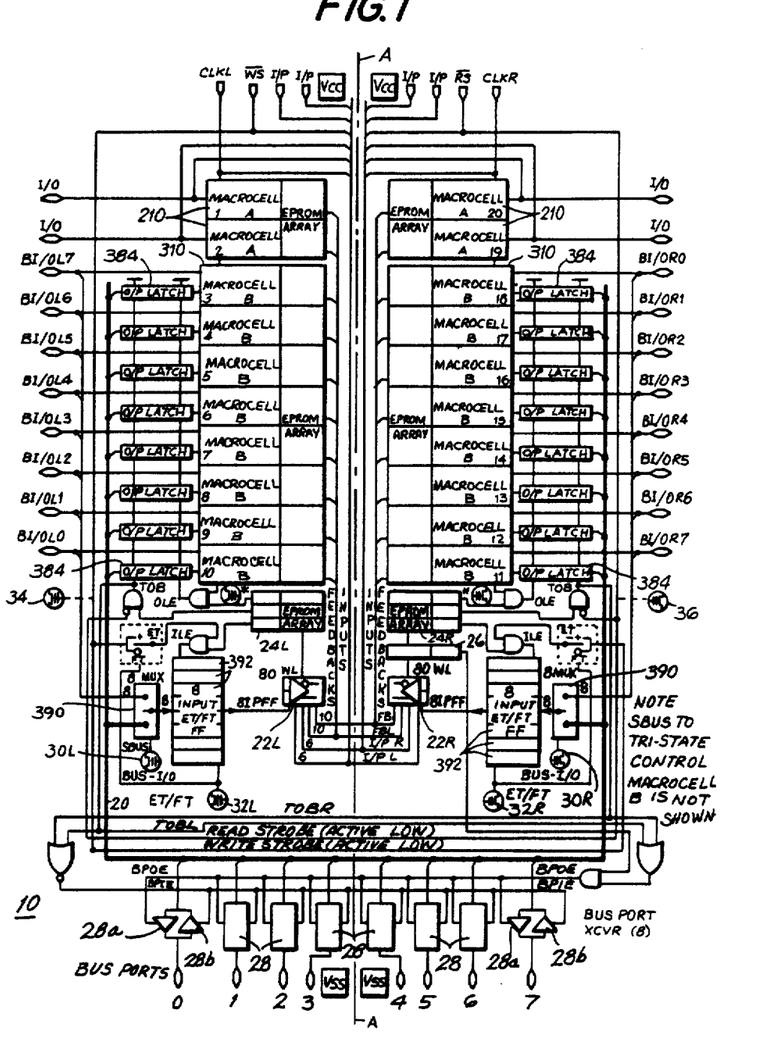
FIG. 1 is a circuit block diagram of an illustrative programmable integrated circuit logic array device constructed in accordance with the principles of this invention.

An illustrative programmable integrated circuit logic array device 10 constructed in accordance with the principles of this invention is shown in FIG. 1. As has been mentioned, device 10 is a device of the general type shown in the patent references mentioned above. Device 10 is typically fabricated as described in the patent references, and it is ultimately made up of various elements, all of which are individually shown in the patent references and/or are individually well-known to those skilled in the art.

With some minor exceptions, device 10 is substantially symmetrical about a central vertical axis A—A as viewed in FIG. 1. The letter L is used in some component or signal names associated with the left side of the device, and the letter R is used in a similar way in connection with the right side of the device. The letters L and R are either omitted or replaced by the letter X when a name generic to the left and right sides is needed. The letter N is sometimes added to a signal name to indicate the logical inverse ("bar") of the signal without the N. Because of the substantially symmetrical nature of device 10, it will generally only be necessary to describe one side in detail, it being understood that the same description applies to the other side as well.

The central elements of device 10 are the elements labelled Macrocell A and Macrocell B. Typical Macrocells A and B are shown in more detail in FIGS. 2 and 3, respectively. Each Macrocell A 210 or B 310 includes an erasable, electronically-programmable Logic Array 212 or 312 (labelled EPROM Array in FIG. 1) which can be programmed to perform various logic functions as shown and described, for example, in the patent references. Device 10 includes four A Macrocells 210 and 16 B Macrocells 310. The A Macrocells are somewhat simpler than the B Macrocells, and unlike the B Macrocells, are not directly connected to internal bus 20.

Considering now the external connections of device 10, starting at the top of FIG. 1 and going counterclockwise around that drawing, VCC represents a power supply terminal or pin (typically +5 volts; logic 1). The next two pins (I/P) are input pins, each of which is connected to a respective pair of word line drivers in each of word line driver arrays 22L and 22R. (Each word line driver array 22 includes 40 devices, each of which drives one word line and its complementary word line in the associated EPROM Array as represented, for example, by the horizontal lines 40, 41, 42, etc., in FIG. 5 of U.S. Pat. No. 4,617,479). The signals applied to the I/P pins are general-purpose input signals which would typically come from the external microprocessor (not shown but entirely conventional) associated with device 10, or from other devices in the electronic system.

The next pin is the inverse Write Strobe (WS bar) pin. The signal applied to this pin is applied (like an I/P signal) to arrays 22, and is also usable as a write strobe input signal for indicating that the microprocessor associated with device 10 is ready to write data to device 10.

The next pin is the Clock Left (CLKL) pin. The signal applied to this pin is (1) applied to arrays 22 like an I/P signal, (2) optionally usable as a synchronous clock signal for the register flip-flops 230 (FIG. 2) and 330 (FIG. 3) of left side Macrocells 210 and 310, and (3) optionally usable in the Fast Output Latch Enable (Fast OLE) mode (described in detail later) to assist in timing the operation of the left side Macrocell B output latches 384.

The next two pins are Input/Output (I/O) pins which can be used either for data input to or data output from the associated A Macrocells. In a typical application, these pins might be connected to the address or control bus of the associated microprocessor-driven system, or to other devices in the electronic system.

The next eight pins are B Macrocell Input/Output Left (BI/OL) pins. These are similar to the above-mentioned I/O pins, but for the associated B Macrocells. (In FIG. 3 the corresponding pin is merely labelled I/O Pin.)

Along the bottom of device 10 as viewed in FIG. 1 are eight Bus Port (0-7) pins. In a typical application, these pins might be connected to the data bus of the associated microprocessor-driven system for allowing byte-wide exchange of data between that external data bus and eight-conductor internal bus 20.

VSS represents ground (0 volts; logic 0).

On the right-hand side as viewed in FIG. 1 are eight more B Macrocell Input/Output Right (BI/OR) pins similar to the BI/OL pins, and two more A Macrocell Input/Output (I/O) pins similar to the I/O pins on the left-hand side.

The final signals to be discussed are (1) the Clock Right (CLKR) signal which is similar to the CLKL signal but for the right-hand Macrocells, (2) the inverse Read Strobe (RS bar) signal which is similar to the WS bar signal but indicates that the associated microprocessor is ready to read data from device 10, and (3) two more I/P pins similar to the previously described I/P pins.

Figure 4:
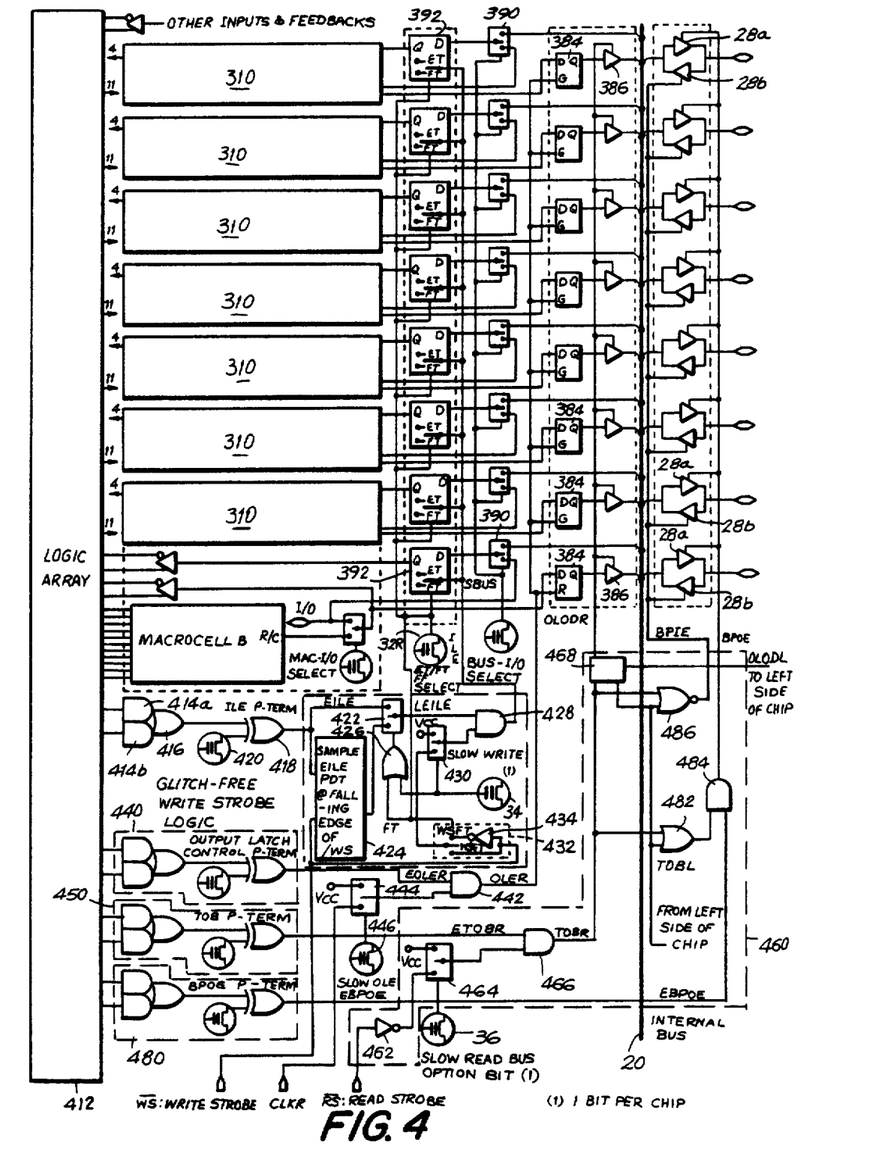

In addition to the A and B Macrocells mentioned above, each half of device 10 includes three smaller Macrocell-type elements (collectively 24L or 24R) for respectively generating Output Latch Enable (OLE), Transfer Output to Bus (TOB), and Input Latch Enable (ILE) signals. (Although FIG. 1 shows the TOB signals being applied directly to Output Latches 384, the more detailed depiction provided in FIG. 4 shows that TOBL and TOBR are processed by logic element 468 to produce the Output Latch Output Disable Left and Right (OLODL and OLODR) signals which are the control signals actually applied to Output Latches 384.) The right-hand side of device 10 also includes one more small Macrocell-type device 26 for generating a Bus Port Output Enable (BPOE) signal.

Along the bottom of FIG. 1 each Bus Port pin 0-7 has a pair of tri-state driver elements 28a and 28b. When enabled by the BPOE signal, each element 28a allows data to flow from an associated lead of internal bus 20 to the associated Bus Port pin. When enabled by the Bus Port Input Enable (BPIE) signal, each element 28b allows data to flow from the associated Bus Port pin to an associated lead of eight-conductor internal bus 20. When not enabled as described above, each element 28a or 28b blocks the flow of data through that element.

The other elements shown in FIG. 1 (e.g., the 16 Output Latches (0/P Latch) 384, the 16 Input ET/FT Flip-Flops 392, and the 16 multiplexers (MUX) 390) are shown again elsewhere (e.g., FIG. 3) and are more readily discussed in connection with those other drawings.

Figure 2:
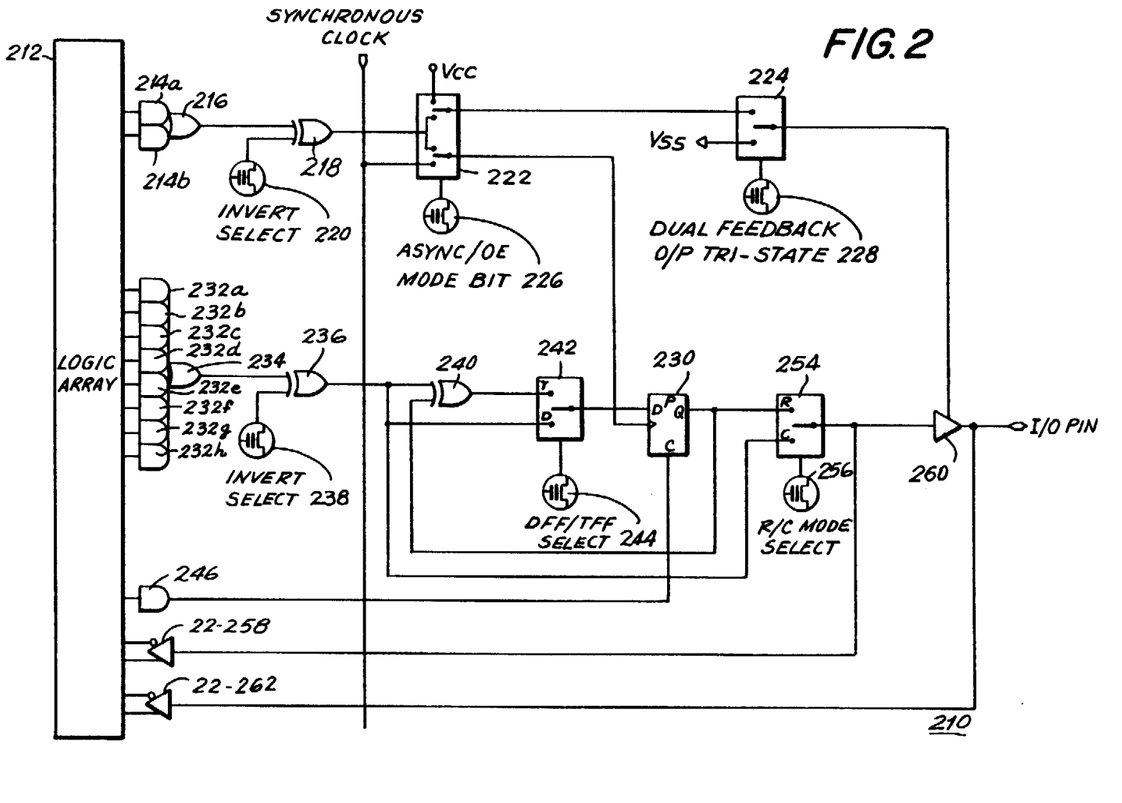
FIGS. 2-4 are more detailed circuit block diagrams of portions, of the device of FIG. 1.

As mentioned above, a typical A Macrocell 210 is shown in more detail in FIG. 2. Macrocell 210 makes use of 11 product terms in Logic Array 212. (Each product or P term corresponds, for example, to one vertical column 32, 34, 36, etc., in FIG. 5 of U.S. Pat. No. 4,617,479.) The top two P terms are logically combined by AND gates 214a and 214b and OR gate 216 and (optionally) inverted by EXCLUSIVE OR gate 218 to produce an output signal which can be used either as an asynchronous clock signal for controlling register flip-flop 230 or for enabling tri-state driver element 260. Whether or not the output signal of OR gate 216 is inverted by EXCLUSIVE OR gate 218 depends on the state of Invert Select element 220. Element 220 is an erasable, electronically-programmable read-only memory (EPROM) element used for controlling the "architecture" of Macrocell 210 (and therefore the architecture of device 10). Accordingly, it may be similar to the EPROM architecture control elements shown and described, for example, in U.S. Pat. No. 4,617,479 and in U.S. patent application Ser. No. 742,089. (Similar EPROM architecture control elements are represented by the same schematic symbol throughout the drawings of this application.)

The destination of the output signal of EXCLUSIVE OR gate 218 is controlled by multiplexer elements 222 and 224 (each of which may be similar to multiplexer elements shown and described, for example, in U.S. Pat. No. 4,617,479). Multiplexer 222 is controlled by ASYNC/OE Mode Bit element 226 (an EPROM element similar to element 220) and has the characteristics of a double-pole double-throw switch. In one state, element 226 causes multiplexer 222 to apply the output signal of gate 218 to the clock input of register 230 and VCC (logic 1) to multiplexer 224. In the other state, element 226 causes multiplexer 222 to apply the Synchronous Clock signal (CLKL or CLKR in FIG. 1) to register 230 and the output of gate 218 to multiplexer 224. Multiplexer 224 is controlled by Dual Feedback O/P Tri-State element 228 (an EPROM element similar to element 220) and is like a single-pole double-throw switch. In one state (Output or O/P), element 228 causes multiplexer 224 to apply the output signal of multiplexer 222 to tri-state driver element 260 (to selectively connect the output of multiplexer 254 to the associated I/O Pin in synchronization with a logic 1 state in the output of gate 218). In the other state (Dual Feedback), element 228 causes multiplexer 224 to apply VSS (logic 0) to driver element 260 (to interrupt the signal path between multiplexer 254 and the associated I/O pin). In that way, the I/O pin can be used as an input through word line driver 22-262 (one portion of array 22L or 22R in FIG. 1) independent of internal feedback from multiplexer 254 through word line driver 22-258 (another portion of array 22L or 22R in FIG. 1).

Eight other P terms in Logic Array 212 are logically combined by AND gates 232a-h and OR gate 234 and (optionally) inverted by EXCLUSIVE OR gate 236, the inversion function of which is controlled by Invert Select EPROM element 238 (similar to 220). The output signal of gate 236 is applied directly to the Data (D) input terminal of multiplexer 242 (similar to 224) and the Combinatorial (C) input terminal of multiplexer 254 (also similar to 224). It is also applied to EXCLUSIVE OR gate 240, together with the Q output of register 230, and the resulting signal is applied to the Toggle (T) input terminal of multiplexer 242. Multiplexer 242 is controlled by DFF/TFF Select EPROM element 244 (similar to 220) and is like a single-pole double-throw switch. Accordingly, in one state, element 244 causes multiplexer 242 to apply the output of gate 240 to the Data (D) input terminal of register 230. (This is the Toggle, J-K or R-S flip-flop operation described in more detail in U.S. patent application Ser. No. 722,684.) In the other state, element 244 causes multiplexer 242 to apply the output of gate 236 to the D input terminal of register 230. In addition to being fed back to gate 240, the Q output signal of register 230 is applied to the Register (R) input terminal of multiplexer 254. Accordingly, multiplexer 254, which is controlled by R/C Mode Select EPROM element 256 (similar to 220), can apply to its output terminal either the output signal of register 230 (i.e., a Register (R) output) or the unregistered Combinatorial (C) output signal of gate 236. The resulting multiplexer 254 output signal is fed back to Logic Array 212 via word line driver array element 22-258, and it may also be applied to the associated I/O Pin via driver element 260 if that driver element is enabled as discussed above. The signal applied to the I/O Pin shown in FIG. 2 is applied to Logic Array 212 via word line driver array element 22-262. This signal may be either the output of driver element 260 as described immediately above, or it may be an external input signal as described in connection with FIG. 1.

The final P term in the portion of Logic Array 212 associated with Macrocell 210 is applied to the reset (C) input terminal of register 230 via AND gate 246.

From the foregoing, it will be seen that among the characteristics of Macrocell 210 are the following: It can be programmed (element 226) to be clocked either synchronously (Synchronous Clock) or asynchronously (from the output of gate 218). It can be programmed (element 256) to produce either register (R) or combinatorial (C) output signals at the output of multiplexer 254. It can be programmed (element 228) to feed back the output of multiplexer 254 to Logic Array 212 either with or without also applying that multiplexer output to the associated I/O Pin. If the output of multiplexer 254 is fed back to Logic Array 212 without being applied to the associated I/O Pin, the I/O Pin remains free for use as an external input. Because the output signal of gate 218 is the logical combination of two P terms and a selective inversion (rather than being just a single P term output with no selective inversion as in prior art devices), that output signal can be a much more logically complex signal than in the past, thereby greatly enhancing the flexibility and utility of the device in relation to the generation of either an asynchronous clock signal (applied via element 222 to register 230) or an output enable signal (applied via elements 222 and 224 to element 260).

Figure 3:
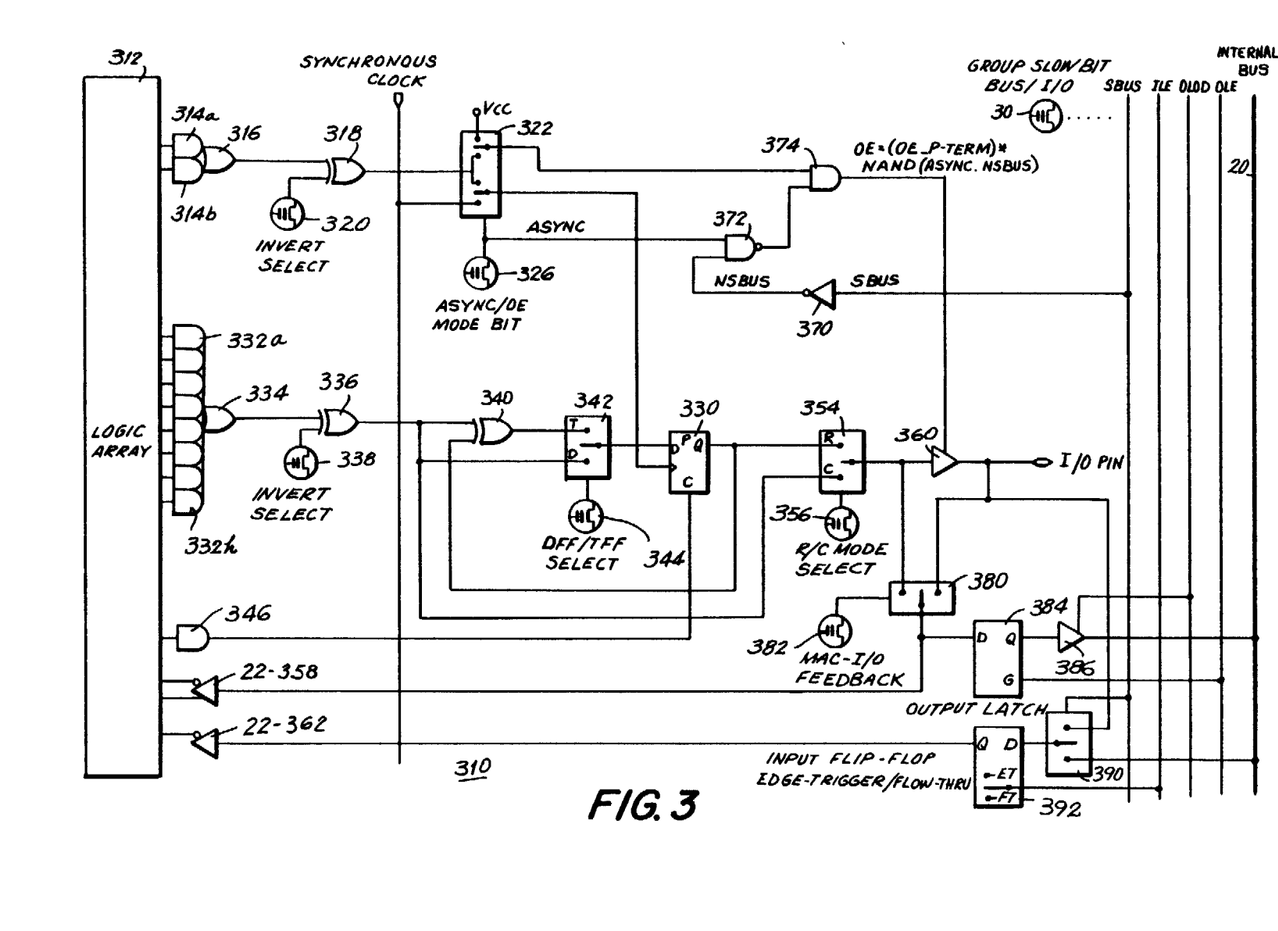

A typical B Macrocell 310 is shown in FIG. 3. Components of Macrocell 310 that are similar to components of Macrocell 210 have reference numbers with the same last two digits as the corresponding component of Macrocell 210. Thus, for example, element 320 in FIG. 3 is similar to element 220 in FIG. 2. These similar, and therefore correspondingly numbered elements, will not be discussed again in detail in connection with FIG. 3.

In addition to the components and features described above for Macrocell 210, Macrocell 310 has the following components and features: In addition to controlling multiplexer 322, the output signal of ASYNC/OE Mode Bit EPROM element 326 is applied to NAND gate 372. The other input to gate 372 is the Select Bus (SBUS) signal inverted by inverter 370. The SBUS signal is produced by one of two Bus I/O EPROM elements 30L or 30R (FIG. 1) for controlling, inter alia, whether the associated B Macrocell input latches are to accept data from internal bus 20 or from the associated I/O Pin. The output signal of NAND gate 372 is applied to AND gate 374 along with one output of multiplexer 322. The Output Enable (OE) output signal of AND gate 374 is used to control element 360. Accordingly, if the synchronous mode is selected (ASYNC=0), the output signal of gate 318 is applied to element 360 regardless of the state of SBUS. On the other hand, if the asynchronous mode is selected (ASYNC=1), the state of SBUS controls whether or not VCC is applied to element 360 (i.e., VCC is applied to element 360 only if SBUS=1).

Unlike Macrocell 210, in Macrocell 310 the output signal of multiplexer 354 is not necessarily fed back via element 22-358. Instead, the multiplexer 354 output signal is applied to one input terminal of multiplexer 380, the other input of which is connected to the associated I/O Pin. Multiplexer 380 is similar to multiplexer 354 and is controlled by MAC-I/O Feedback EPROM element 382 (similar to 220) to connect either of its inputs to its output depending on the state of element 382. Thus the signal applied to element 22-358 can be either the fed back output signal of multiplexer 354 or the signal (usually an external input signal) applied to the associated I/O Pin.

The output signal of multiplexer 380 is also applied to the Data (D) input terminal of Output Latch 384 (labelled O/P Latch in FIG. 1). Output Latch 384 accepts the applied signal when and if enabled by the Output Latch Enable (OLE) signal applied to its G input terminal. When and if tri-state driver element 386 (similar to element 360) is enabled by the Output Latch Output Disable (OLOD) signal, the Q output of Output Latch 384 is applied to one associated lead of eight-conductor internal bus 20. Accordingly, the output signal of multiplexer 380 can be applied to internal bus 20 if desired.

In addition to being applied to multiplexer 380, the I/O Pin signal is applied to one input of multiplexer 390 (one of the multiplexers labelled 8 MUX in FIG. 1). The other input of multiplexer 390 is the associated lead of internal bus 20. Multiplexer 390 (similar to 380) is controlled by the SBUS signal. When SBUS=0, multiplexer 390 applies the I/O Pin signal to the Data (D) input of Input Flip-Flop 392 (one of the flip-flops labelled 8 Input ET/FT FF in FIG. 1). When SBUS=1, multiplexer 390 applies the associated internal bus signal to Input Flip-Flop 392. The Q output signal of Input Flip-Flop 392 is applied to Logic Array 312 via driver element 22-36z. Accordingly, either the I/O Pin signal or the internal bus signal can be applied to Logic Array 312 via elements 390, 392, and 22-36z. (The Edge-Trigger (ET) and Flow-Through (FT) modes of Input Flip-Flop 392 are discussed below.)

FIG. 4 shows portions of the right half of device 10 in more detail than is shown in FIG. 1. In particular, the lower portion of FIG. 4 shows the smaller Macrocells 24R and 26 in more detail. These Macrocells generate the Input Latch Enable (ILE), Output Latch Enable (OLE), Output Latch Output Disable Left and Right (OLODL and OLODR), and Bus Port Output Enable (BPOE) signals. The corresponding left-hand portions of device 10 (especially smaller Macrocells 24L) are similar and therefore need not be shown or described in detail. Because there is only one BPOE signal for the entire chip, Macrocell 26 is not duplicated on the left-hand side of device 10.

Logic Array 412 (labelled EPROM Array in FIG. 1 and identified by reference numbers 212 and 312 in FIGS. 2 and 3) has already been described. Two product or P terms of Logic Array 412 are logically combined by AND gates 414a and 414b and OR gate 416 and (optionally) inverted by EXCLUSIVE OR gate 418 to produce the Enable Input Latch Enable (EILE) signal. The inversion function of gate 418 is controlled by invert select element 420, which is another EPROM element like element 220 in FIG. 2.

The further processing of the EILE signal to produce the ILE signal is based on (1) whether or not the Slow Write mode is selected, and (2) whether the Edge-Trigger (ET) mode or the Flow-Through (FT) mode is selected. In the Fast Write mode (or the Fast Read mode) (which are respectively the complements of the Slow Write and Slow Read modes), the timing of input/output functions is controlled by the WS bar and RS bar signals, with the product or P term signals from Logic Array 412 being the enabling signals. In other words, in the Fast modes the WS bar and/or RS bar signals are not delayed by having to propagate through Logic Array 412. In contrast, in the Slow Write mode (or Slow Read mode) the P terms are both the timing and enabling signals for the input/output functions. The Slow modes therefore free up the WS bar and RS bar pins for use as ordinary input pins if desired.

Either ET or FT can be used in either Fast or Slow mode, and determine whether the input register will be edge-triggered or flow-through. In ET mode, certain transitions (edges) in control signals trigger certain functions of device 10, especially the input/output functions of the device. In FT mode, certain logical levels (i.e., logic 1 or logic 0) of the control signals effect control of device 10, especially its input/output functions. Accordingly, ET can be used to provide more precisely timed control than is possible with FT. The combination of Fast mode and ET makes possible very rapid and precisely timed communication (especially Bus Port communication) with an associated microprocessor. This is especially advantageous with higher-speed microprocessors.

The ET/FT mode selection is controlled by ET/FT Flip-Flop Select EPROM elements 32L and 32R. Thus a separate ET/FT mode selection can be made for each half of the chip. The Slow Write and Slow Read mode selections (each of which applies to the entire chip) are respectively controlled by Slow Write and Slow Read select EPROM elements 34 and 36.

Considering now the EILE signal processing logic shown in FIG. 4, the output of gate 418 is applied to one input of multiplexer 422 and also to element 424 (labelled Sample EILE Product Term at Falling Edge of WS bar). The other input to element 424 is the WS bar signal. As the label implies, element 424 latches in the logical state of the output of gate 418 concurrent with the falling edge of the WS bar signal. The output signal of element 424 is this latched signal, and it is applied to the other input of multiplexer 422. The state of multiplexer 422 is controlled by the output of OR gate 426, the inputs of which are the FT and Slow Write mode selection signals. If either FT or Slow Write is selected, then multiplexer 422 applies the EILE signal to AND gate 428. On the other hand, if both ET and Fast Write are selected, then multiplexer 422 applies the output of element 424 to AND gate 428. The other input to AND gate 428 is derived from multiplexer 430 (controlled by the Slow Write selection signal). If Slow Write is selected, then multiplexer 430 applies VCC (logic 1) to AND gate 428. Otherwise, multiplexer 430 applies the output of element 432 to AND gate 428. Element 432 is a multiplexer including an inverter 434 in one of its input paths. The WS bar signal is applied to both input paths of element 432, and the state of the multiplexer in that element is controlled by the FT signal. Accordingly, when FT is selected, element 432 applies an inverted WS bar signal (WS or WSFT) to multiplexer 430, and when ET is selected, element 432 applies WS bar (WSET) to multiplexer 430. The output signal of AND gate 428 is the ILE signal used to enable Input Flip-Flop latches 392 in B Macrocells 310. As shown in FIG. 4, each of latches 392 effectively has an ET mode and an FT mode selected by the associated ET/FT Flip-Flop Select element 32. In the ET mode, each latch 392 responds to certain transitions in the ILE signal (in particular, to the ILE signal transition concurrent with the rising edge of the WS bar signal). In the FT mode, on the other hand, each latch 392 accepts data when the WS bar signal goes to logic 0. An illustrative implementation of a typical latch 392 is shown in FIG. 7 and described below.

Figure 7:
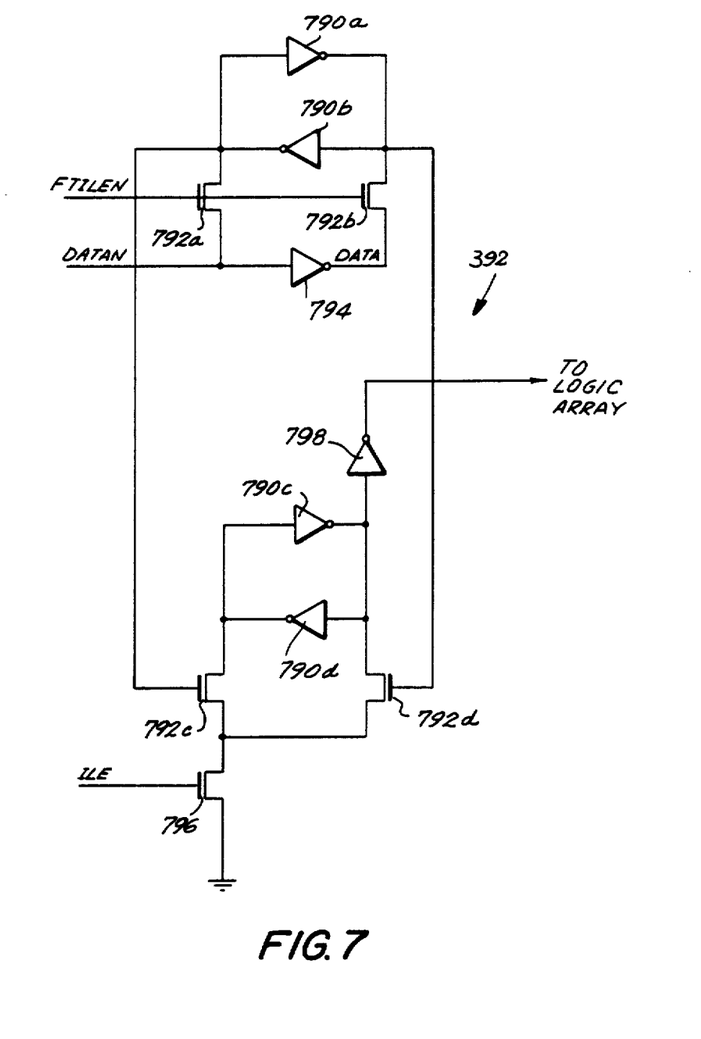
FIG. 7 is a more detailed circuit diagram of a component shown in FIGS. 1, 3, and 4.

As shown in FIG. 7, typical Input Flip-Flop latch 392 includes an upper "master" stage including cross-coupled inverters 790a and 790b, and a lower "slave" stage including cross-coupled inverters 790c and 790d. The FTILEN signal couples the signals DATAN and DATA to the master stage via N-channel transmission gates 792a and 792b. FTILEN is a logical combination of the ET/FT mode selection signal and the ILE signal. In FT mode, FTILEN=1 at all times. In ET mode, FTILEN = ILEN. The Data signal to be selectively latched into latch 392 is applied directly to one side of the master stage and is inverted by inverter 794 for application to the other side of the master stage. The two sides of the master stage are respectively coupled to the two sides of the slave stage via N-channel transmission gates 792c and 792d. The ILE signal is used to transfer data from the master stage to the slave stage via N-channel transmission gates 792c and 792d and N-channel transistor 796. The output of the latch is derived from buffer 798. Accordingly, in the ET mode (FTILEN = ILEN), latch 392 latches in the Data signal value as FTILEN transitions from logic 1 to logic 0. In the FT mode (FTILEN=1), on the other hand, the Data signal "flows through" gates 792a and 792b, and latch 392 latches in the Data signal value when ILE reaches 0.

From the foregoing it will be seen in relation to FIG. 4 that the selection of Fast Write causes the WS bar signal to be logically combined with the ILE P term signal without the WS bar signal being subject to the propagation delays associated with Logic Array 412. Assuming that Fast Write has been selected, the additional selection of ET causes input latches 392 to accept data from internal bus 20 concurrent with particular transitions in the ILE signal, which transitions are in turn concurrent with certain transitions in the WS bar signal (in particular, the rising edge of the WS bar signal). Accordingly, the timing of data input to latches 392 can be controlled very precisely in relation to the WS bar signal, thereby facilitating rapid data communication via internal bus 20. And since internal bus 20 is connected to the Bus Port, this in turn makes possible the precisely timed Bus Port data communication required for direct connection of device 10 to high-speed microprocessors.

Considering now the generation of the OLE signal, the output signals of two P terms in Logic Array 412 are logically combined by the collection of elements 440 (similar to elements 414, 416, 418, and 420) to produce the Enable Output Latch Enable Right (EOLER) signal applied to one input of AND gate 442. The other input to AND gate 442 comes from multiplexer 444 and is either VCC (logic 1), if the Slow OLE mode is selected by EPROM element 446 (similar to 220), or the CLKR signal if the Fast OLE mode (complement of the Slow OLE mode) is selected. The OLER output signal of AND gate 442 is applied to the G or enable input terminal of the Output Latch 384 in each B Macrocell 310 on the right-hand side of device 10. (The corresponding OLEL signal is used similarly on the left-hand side of device 10.) Accordingly, it will be seen that the Fast and Slow OLE modes are conceptually and operationally similar to the Fast and Slow Read and Write modes. In the Fast OLE mode, the timing of the OLE signal is controlled by the associated CLK signal (undelayed by having to pass through Logic Array 412), with the Output Latch Control P terms providing the enabling signal. In the Slow OLE mode, on the other hand, the P terms are both the timing and enabling signal, thereby freeing the associated CLK pin for use as an ordinary input pin if desired. As will become more apparent as the description proceeds, the Fast OLE mode facilitates the Fast Read mode of operation.

Turning now to the generation of the OLODR and OLODL signals, the output signals of two P terms in Logic Array 412 are logically combined by the collection of elements 450 (similar to elements 414, 416, 418, and 420) to produce the Enable Transfer Output to Bus Right (ETOBR) signal applied to the collection elements surrounded by dotted line 460. FIG. 4 shows the overall logic employed to produce the Transfer Output to Bus Right (TOBR) signal from the ETOBR signal, and also the overall logic employed to produce the OLODR, OLODL, Bus Port Input Enable (BPIE), and BPOE signals from the TOBR and TOBL signals. This logic is shown in more detail in FIGS. 5 and 6. (Some signals have different names in FIG. 4, on the one hand, and in FIGS. 5 and 6, on the other hand. Signal correspondence is as follows: RSN = RS bar; SLORDN = Slow Read Not or Fast Read; TOBLPT = TOB Left Product Term or ETOBL; TOBRPT = TOB Right Product Term or ETOBR; TOBLN = TOB Left Not or TOBL bar; TOBRN = TOB Right Not or TOBR bar; BPOEPT = BPOE Product Term or EBPOE.) As shown in FIG. 4, the RS bar signal is inverted by inverter 462 and applied to one input of multiplexer 464. The other input of multiplexer 464 is connected to VCC (logic 1), and the state of multiplexer 464 is controlled by Slow Read select EPROM element 36 which has already been described. Accordingly, when Fast Read (the complement of Slow Read) is selected, multiplexer 464 applies the inverted RS bar (RS) signal to one input of AND gate 466. On the other hand, when Slow Read is selected, multiplexer 464 applies VCC to AND gate 466. The other input to AND gate 466 is the ETOBR signal described above.

Figure 5:
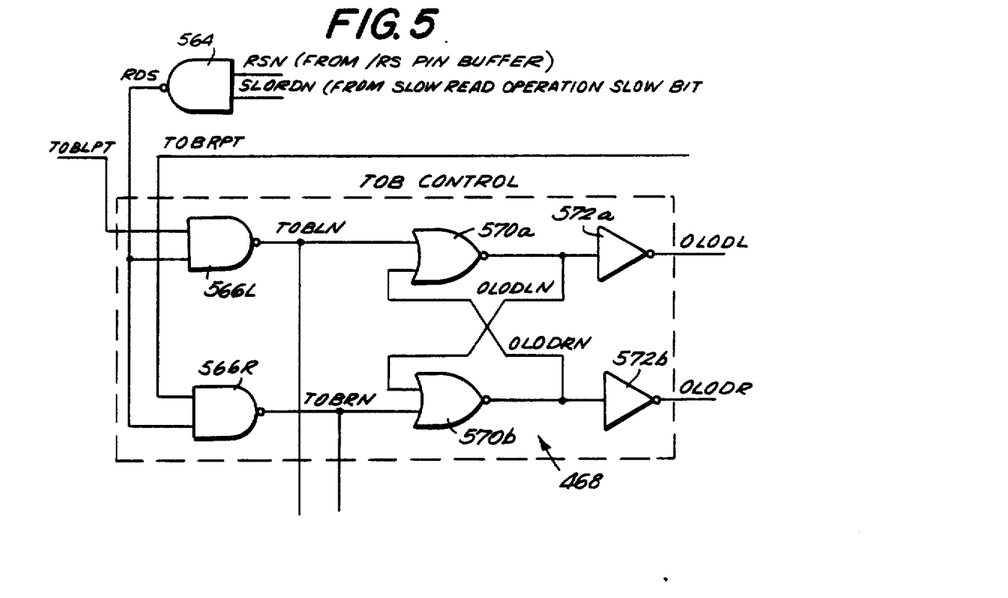
FIGS. 5 and 6 are more detailed circuit diagrams of portions of the apparatus shown in FIGS. 1 and 4.
Figure 6:
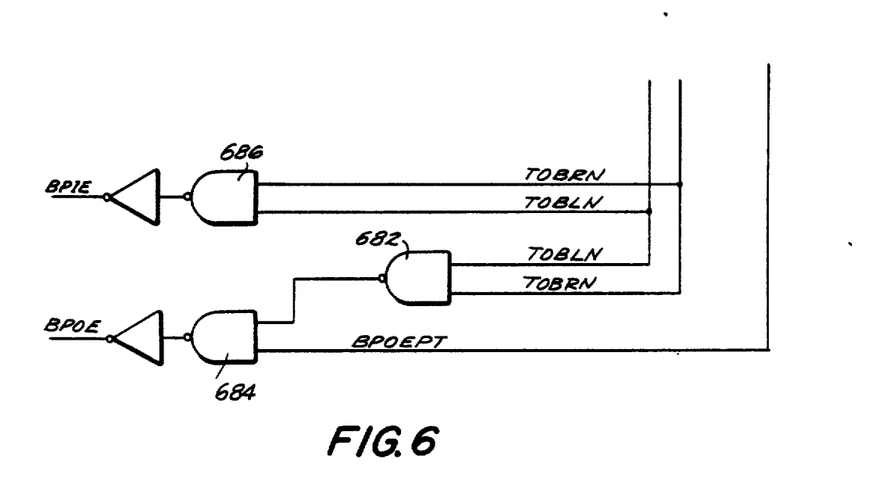

The TOBR output signal of AND gate 466 is logically combined with the TOBL signal (generated similarly on the left side of the chip) by logic element 468. Logic element 468 is shown in detail in FIG. 5 (with some additional elements that have already been described and with the addition of the left side counterpart of AND gate 466). (Because FIGS. 5 and 6 are closer to a chip implementation, the types of logic elements shown in these drawings differ slightly from their counterparts in FIG. 4. The basic correspondence of the elements is indicated by using the same last two reference number digits throughout FIGS. 4-6.) As shown in FIG. 5, logic element 468 includes NOR gates 570a and 570b and inverters 572a and 572b interconnected so that the first-occurring one of TOBL and TOBR causes the Output Latches 384 on the associated side of device 10 to seize internal bus 20. This is done by producing appropriate OLODL and OLODR signals for application to driver elements 386. In this way, any possible contention between the two sides of device 10 for the use of internal bus 20 is automatically resolved in favor of the side whose TOB signal is first applied to logic element 468. The side of device 10 that was not previously allocated the bus would be allocated the bus after the first-applied TOB signal returned to zero, provided that the TOB signal that came in later remained valid.

As in the case of Fast Write vs. Slow Write, in the Fast Read mode the RS bar signal provides the timing for data transfer from Output Latches 384 to internal bus 20 without having to propagate through Logic Array 412. Fast Read data transfer can therefore be timed much more precisely than Slow Read data transfer in which both the timing and enabling information comes from Logic Array 412. Fast Read can therefore be used (typically in conjunction with Fast OLE) to facilitate higher speed data communication, and especially communication via the Bus Port with a high-speed microprocessor.

Considering now the signals for enabling the Bus Port (shown at the bottom of FIG. 1 and again along the right-hand side of FIG. 4), the output signals of two P terms in Logic Array 412 are logically combined by the collection of elements 480 (similar to elements 414, 416, 418, and 420) to produce the Enable Bus Port Output Enable (EBPOE) signal. This signal is logically combined with TOBL and TOBR as shown in FIG. 4 (and again in FIG. 6) to produce BPOE and BPIE. As shown, for example in FIG. 4, if either the left or right side of device 10 wants to output data to internal bus 20, one or the other of the TOB signals will be logic 1, thereby causing the output of OR gate 482 to be logic 1. If EBPOE is also logic 1, the output of AND gate 484 will be logic 1 and Bus Port output driver elements 28a will be enabled. Data appearing on internal bus 20 can therefore be transferred via the Bus Port from device 10 to an external device such as an associated microprocessor. At the same time, whenever either of the TOB signals is logic 1, NOR gate 486 causes BPIE to go to logic 0, thereby disabling Bus Port input driver elements 28b. This prevents any external device (such as an associated microprocessor) from putting any data on internal bus 20 via the Bus Port while either the left or right side of device 10 is attempting to write to the internal bus. On the other hand, when neither of the TOB signals is logic 1 and internal bus 20 is therefore free, BPIE is logic 1, thereby enabling Bus Port input drivers 28b. An external device such as a microprocessor can then transfer data to device 10 via the Bus Port and internal bus 20. BPOE is zero whenever BPIE is one.

With regard to arbitration of possibly competing external demands for use of the Bus Port, note that (as shown in FIG. 1 and as described above) both the WS bar and RS bar signals go to the EPROM Arrays, as well as to the logic circuits which allow the Fast Read and Fast Write modes of operation (also described above). In the event that the conditions for both the Read operation (outputting data via the Bus Port) and the Write operation (inputting data via the Bus Port) occur simultaneously, an arbitration protocol can be established by appropriate programming of the programmable elements in the EPROM Arrays (labelled Logic Array 412 in FIG. 4) controlled by the WS and RS word lines in the P terms that generate EBPOE, ETOBR, ETOBL, and EILE. For example, if the Write operation is to take precedence over the Read operation, then the ETOB and EBPOE product terms could be conditioned in Logic Array 412 by the WS signal applied to the Logic Array such that ETOB and EBPOE can only be 1 when WS bar is 1 (i.e., when there is no Write operation request as indicated by WS being 0). Alternatively, if the Read operation is to take precedence over the Write operation, then the EILE product term could be conditioned in Logic Array 412 by the RS signal applied to the Logic Array such that EILE can only be 1 when RS bar is 1 (i.e., when there is no Read operation request as indicated by RS being 0).

As can be seen from the foregoing, elements 460 allocate use of internal bus 20 so that conflicting uses cannot be made simultaneously. The following is a tabulation of possible uses of internal bus 20 and the control signals that allow each use and prevent other conflicting simultaneous uses:

| Internal Bus Function | BPIE | ILEX | TOBX | BPOE |
|---|---|---|---|---|
| 1. Bus Port to left or right side or to both sides | 1 | 1,0<br>0,1<br>1,1 | 0,0 | 0 |
| 2. Left or right side to Bus Port | 0 | 0,0 | 1,0<br>0,1 | 1 |
| 3. Left side to right side or vice versa (without simultaneous Bus Port output) | 0 | 1,0<br>0,1 | 0,1<br>1,0 | 0 |
| 4. Left side to right side or vice versa (with simultaneous Bus Port output) | 0 | 1,0<br>0,1 | 0,1<br>1,0 | 1 |

Although the term EPROM has been used above in connection with programmable elements such as the EPROM Arrays in FIG. 1 and the architecture control elements like element 220 in FIG. 2, it will be understood that these programmable elements can alternatively be implemented in many other ways known to those skilled in the art. Among the possible alternatives to EPROMs are electronically-erasable, electronically-programmable read-only memories (EEPROMs), fusable elements, random-access memories (RAMs), read-only memories (ROMs), and any other programmable and/or re-programmable storage elements, all of which (including EPROMs) are referred to herein and in the appended claims as "programmable elements" or "programmable means". Similarly, although these programmable elements or programmable means are sometimes described and claimed herein as producing output signals indicative of their states, it will be understood that this is merely convenient, generic terminology, and that in many embodiments within the scope of the description and claims, these elements merely process an applied signal differently depending on the programmed state of the programmable element.

It will be understood that the foregoing is merely illustrative of the principles of the invention, and that various modifications can be made by those skilled in the art without departing from the scope and spirit of the invention. For example, the number of A and B Macrocells can be changed as desired, as can the number of Logic Array P terms employed in each Macrocell.

I claim:

1. A programmable integrated circuit logic array device comprising:
    a first macrocell including (1) first input means for selectively receiving data applied to said first macrocell and (2) first output means for selectively outputting data from said first macrocell;
    a second macrocell including (1) second input means for selectively receiving data applied to said second macrocell and (2) second output means for selectively outputting data from said second macrocell;
    a third macrocell including (1) third input means for selectively receiving data applied to said third macrocell and (2) third output means for selectively outputting data from said third macrocell;
    a fourth macrocell including (1) fourth input means for selectively receiving data applied to said fourth macrocell and (2) fourth output means for selectively outputting data from said fourth macrocell;
    a bus including first and second signal conductors, said first signal conductor being connectable to (1) said first and second input means and (2) said first and second output means, and said second signal conductor being connectable to (1) said third and fourth input means and (2) said third and fourth output means; and
    control means for selectively allowing either (1) said first output means to output data to said first signal conductor and said third output means to output data to said second signal conductor, or (2) said second output means to output data to said first signal conductor and said fourth output means to output data to said second signal conductor, said control means including means for preventing (1) said first and second output means from simultaneously outputting data to said first signal conductor and (2) said third and fourth output means from simultaneously outputting data to said second signal conductor, wherein said control means further comprises:

first transfer output to bus means for producing a first request signal when data is to be output by said first and third macrocells;

second transfer output to bus means for producing a second request signal when data is to be output by said second and fourth macrocells; and bus arbitration logic means responsive to said first and second request signals for enabling said first and third output means if said first request signal is applied to said bus arbitration logic means before said second request signal is applied to said bus arbitration logic means, and for enabling said second and fourth output means if said second request signal is applied to said bus arbitration logic means before said first request signal is applied to said bus arbitration logic means.

2. The device of claim 1 wherein said bus arbitration logic means further comprises:

first means responsive to said first and second request signals for disabling said second and fourth output means when said bus arbitration logic means enables said first and third output means, and for disabling said first and third output means when said bus arbitration logic means enables said second and fourth output means.

3. The device of claim 2 wherein said bus arbitration logic means further comprises:

second means responsive to said first and second request signals for disabling said first and third output means and for enabling said second and fourth output means when said first request signal ends if said second request signal is then still being applied to said bus arbitration logic means, and for disabling said second and fourth output means and for enabling said first and third output means when said second request signal ends if said first request signal is then still being applied to said bus arbitration logic means.

4. A programmable integrated circuit logic array device comprising:

a first macrocell including (1) first input means for selectively receiving data applied to said first macrocell and (2) first output means for selectively outputting data from said first macrocell;

a second macrocell including (1) second input means for selectively receiving data applied to said second macrocell and (2) second output means for selectively outputting data from said second macrocell;

a third macrocell including (1) third input means for selectively receiving data applied to said third macrocell and (2) third output means for selectively outputting data from said third macrocell;

a fourth macrocell including (1) fourth input means for selectively receiving data applied to said fourth macrocell and (2) fourth output means for selectively outputting data from said fourth macrocell;

a bus including first and second signal conductors, said first signal conductor being connectable to (1) said first and second input means and (2) said first and second output means, and said second signal conductor being connectable to (1) said third and fourth input means and (2) said third and fourth output means.

control means for selectively allowing either (1) said first output means to output data to said first signal conductor and said third output means to output data to said second signal conductor, or (2) said second output means to output data to said first signal conductor and said fourth output means to output data to said second signal conductor, said control means including means for preventing (1) said first and second output means from simultaneously outputting data to said first signal conductor and (2) said third and fourth output means from simultaneously outputting data to said second signal conductor;

a bus port connected to said bus and including (1) input gate means for selectively applying to said bus data applied to said bus port by an external device and (2) output gate means for selectively applying to said bus port for application to said external device data from said bus; and additional control means for inhibiting said input gate means while said control means is allowing any of said first, second, third, and fourth output means to output data to said bus.

5. The device of claim 4 further comprising:

further control means for enabling said input gate means while said control means is allowing none of said first, second, third, and fourth output means to output data to said bus.

6. The device of claim 5 further comprising:

still further control means for allowing said output gate means to be enabled only while said control means is allowing said first and third output means or said second and fourth output means to output data to said bus.

7. A programmable integrated circuit logic array device comprising:

a first macrocell including (1) first input means for selectively receiving data applied to said first macrocell and (2) first output means for selectively outputting data from said first macrocell;

a second macrocell including (1) second input means for selectively receiving data applied to said second macrocell and (2) second output means for selectively outputting data from said second macrocell;

a third macrocell including (1) third input means for selectively receiving data applied to said third macrocell and (2) third output means for selectively outputting data from said third macrocell;

a fourth macrocell including (1) fourth input means for selectively receiving data applied to said fourth macrocell and (2) fourth output means for selectively outputting data from said fourth macrocell;

a bus including first and second signal conductors, said first signal conductor being connectable to (1) said first and second input means and (2) said first and second output means, and said second signal conductor being connectable to (1) said third and fourth input means and (2) said third and fourth output means;

control means for selectively allowing either (1) said first output means to output data to said first signal conductor and said third output means to output data to said second signal conductor, or (2) said second output means to output data to said first signal conductor and said fourth output means to output data to said second signal conductor, said control means including means for preventing (1) said first and second output means from simultaneously outputting data to said first signal conductor and (2) said third and fourth output means from simultaneously outputting data to said second signal conductor; and means for causing said second and fourth input means to receive data from said bus when said control means is allowing said first and third output means to output data to said bus so that data can be transferred from said first macrocell to said second macrocell and from said third macrocell to said fourth macrocell via said bus, and for causing said first and third input means to receive data from said bus when said control means is allowing said second and fourth output means to output data to said bus so that data can be transferred from said second macrocell to said first macrocell and from said fourth macrocell to said third macrocell via said bus.

8. A programmable integrated circuit logic array device comprising:

a first macrocell including (1) first input means for selectively receiving data applied to said first macrocell and (2) first output means for selectively outputting data from said first macrocell;

a second macrocell including (1) second input means for selectively receiving data applied to said second macrocell and (2) second output means for selectively outputting data from said second macrocell;

a third macrocell including (1) third input means for selectively receiving data applied to said third macrocell and (2) third output means for selectively outputting data from said third macrocell;

a fourth macrocell including (1) fourth input means for selectively receiving data applied to said fourth macrocell and (2) fourth output means for selectively outputting data from said fourth macrocell;

a bus including first and second signal conductors, said first signal conductor being connectable to (1) said first and second input means and (2) said first and second output means, and said second signal conductor being connectable to (1) said third and fourth input means and (2) said third and fourth output means;

control means for selectively allowing either (1) said first output means to output data to said first signal conductor and said third output means to output data to said second signal conductor, or (2) said second output means to output data to said first signal conductor and said fourth output means to output data to said second signal conductor, said control means including means for preventing (1) said first and second output means from simultaneously outputting data to said first signal conductor and (2) said third and fourth output means from simultaneously outputting data to said second signal conductor;

first input enable means associated with said first and third macrocells for producing a first input enable signal when data is to be input from said bus to said first and third macrocells;

second input enable means associated with said second and fourth macrocells for producing a second input enable signal when data is to be input from said bus to said second and fourth macrocells; and means for applying said first input enable signal to said first and third input means to enable said first and second input means when said first input enable signal is produced, and for applying said second input enable signal to said second and fourth input means to enable said second and fourth input means when said second input enable signal is produced.

9. A programmable integrated circuit logic array device for use with an external device comprising:

a bus port for receiving data from said external device;

input latch means connected to said bus port for selectively latching in data applied to said bus port; and control means for producing a first enable signal for enabling said input latch means, said control means including (1) a programmable element for producing an output signal indicative of whether a fast write mode or a slow write mode has been preselected, (2) write strobe signal processing means for processing a write strobe signal generated by said external device for indicating that said external device is ready to write data to said logic array device, (3) means for generating a second enable signal, (4) first means for producing said first enable signal in response to the occurrence of said second enable signal when said slow write mode is selected, and (5) second means for producing said first enable signal in response to simultaneous occurrence of said second enable signal and said write strobe signal when said fast write mode is selected.

10. The device of claim 9 further comprising:

logic array means having a plurality of inputs; and means for applying to one of said inputs the signal applied to said write strobe signal processing means so that the signal applied to said write strobe signal processing means can also be used by said logic array means.

11. A programmable integrated circuit logic array device for use with an external device comprising:

a bus port for selectively transmitting data to said external device, and control means for producing a bus port output enable signal for enabling said bus port to transmit data to said external device, said control means including (1) a programmable element for producing an output signal indicative of whether a fast read mode or a slow read mode has been preselected, (2) read strobe signal processing means for processing a read strobe signal generated by said external device for indicating that said external device is ready to read data from said logic array device, (3) means for generating an enable bus port output enable signal, (4) first means for producing said bus port enable signal in response to the occurrence of said enable bus port output enable signal when said slow read mode is selected, and (5) second means for producing said bus port output enable signal in response to concurrent generation of (a) said enable bus port output enable signal and (b) said read strobe signal when said fast read mode is selected.

12. The device of claim 11 further comprising:

logic array means having a plurality of inputs; and means for applying to one of said inputs the signal applied to said read strobe signal processing means so that the signal applied to said read strobe signal processing means can also be used by said logic array means.

13. A programmable integrated circuit logic array device for use with an external device comprising:

means for generating data;

a bus;

output latch means for selectively storing said data;

output gate means for selectively applying data stored by said latch means to said bus; and control means for producing an output latch enable signal for enabling said latch means to store data applied to said latch means, said control means including (1) a programmable element for producing an output signal indicative of whether a fast output latch enable mode or a slow output latch enable mode has been preselected, (2) clock signal input means for receiving a clock signal generated by said external device, (3) means for generating an enable output latch enable signal, (4) first means or producing said output latch enable signal in response to the occurrence of said enable output latch enable signal when said slow output latch enable mode is selected, and (5) second means for producing said output latch enable signal in response to simultaneous occurrence of said enable output latch enable signal and said clock signal when said fast output latch enable mode is selected.

14. The device of claim 13 further comprising:

logic array means having a plurality of inputs; and means for applying to one of said inputs the signal applied to said clock signal input means so that the signal applied to said clock signal input means can also be used by said logic array means.

15. The device of claim 13, further comprising:

additional control means for producing an output gate enabling signal for enabling said output gate means to apply the data stored by said latch means to said bus, said additional control means including (a) a programmable element for producing an output signal indicative of whether or not a fast read mode or a slow read mode has been preselected, (b) read strobe signal processing means responsive to a read strobe signal which may be applied to said read strobe signal processing means, (c) means for generating an enable output gate enabling signal, and (d) means responsive to said items a-c for producing said output gate enabling signal in response to the occurrence of said enable output gate enabling signal when said slow read mode is selected, and for producing said output gate enabling signal in response to simultaneous occurrence of said enable output gate enabling signal and said read strobe signal when said fast read mode is selected.

16. A programmable integrated circuit logic array device comprising:

a programmable element programmed to produce an output signal indicative of whether a flow-through mode or an edge-trigger mode of operation of said programmable integrated circuit logic array device is desired;

means for generating a latch enabling control signal having alternating first and second logical states; and input latch means for storing data applied to said input latch means including first means responsive to said first logical state of said latch enabling control signal when said output signal indicates that said flow-through mode is desired, and second means responsive to a change from said second to said first logical state of said latch enabling control signal when said output signal indicates that said edge-trigger mode is desired.

17. A programmable integrated circuit logic array device comprising:

logic array means for producing a logic array output signal;

an input/output pin;

gate means for selectively applying said logic array output signal to said input/output pin;

means for controlling said gate means to selectively apply said logic array output signal to said input/output pin;

a programmable element programmed to produce a first output signal indicative of whether a logic array feedback mode or an I/O feedback mode of operation of said programmable integrated circuit logic array device is desired;

multiplexer means having first and second input terminals selectively connectable to an output terminal, said logic array output signal being applied to said first input, said second input terminal being connected to said input/output pin, and said output terminal being connected to an input of said logic array means, said multiplexer means responding to said programmable element by connecting said first input terminal and said output terminal when said first output signal indicates that said logic array feedback mode is desired, and by connecting said second input terminal and said output terminal when said first output signal indicates that said I/O feedback mode is desired;

a bus for conveying data applied to said bus;

an additional programmable element programmed to produce a second output signal indicative of whether or not a bus mode of operation of said programmable integrated circuit logic array device is desired; and additional multiplexer means having first and second input ports selectively connectable to said first input port, said bus being connected to said second input port, and said output port being connected to an additional input of said logic array means, said additional multiplexer means responding to said additional programmable element by connecting said first input port to said output port when said second output signal indicates that said bus mode is not desired, and by connecting said second input port to said output port when said second output signal indicates that said bus mode is desired.

18. The device of claim 17 wherein said additional logic array input comprises:

input latch means for selectively storing said additional multiplexer output port signal and applying the stored signal to said logic array means.

19. The device of claim 17 further comprising:

a further programmable element programmed to produce a third output signal indicative of whether a flow-through mode or an edge-trigger mode of operation of said programmable integrated circuit logic array device is desired;

control means for generating a latch enabling control signal; and input latch means connected between said additional multiplexer output port and said additional logic array input for storing said additional multiplexer output signal and applying the stored signal to said additional logic array input in response to a predetermined logical state of said latch enabling control signal when said third output signal indicates that said flow-through mode is desired, and for storing said additional multiplexer output signal and applying the stored signal to said additional logic array input in response to a predetermined change in the state of said latch enabling control signal when said third output signal indicates that said edge-trigger mode is desired.

20. A programmable integrated circuit logic array device comprising:

logic array means for producing a logic array output signal, said logic array means having first and second inputs;

means for applying said logic array output signal to said first input;

an input/output pin;

means for applying the signal applied to said input/output pin to said second input;

a programmable element programmed to produce an output signal indicative of whether a dual feedback mode or an output mode of operation of said programmable integrated circuit logic array device is desired; and gate means responsive to said programmable element for applying said logic array output signal to said input/output pin when said output mode is desired, and for interrupting application of said logic array output signal to said input/output pin when said dual feedback mode is desired.

21. A programmable integrated circuit logic array device for use with external apparatus comprising:

a bus port for selectively outputting from said device data read by said external apparatus, and for inputting to said device data written by said external apparatus;

a programmable element programmed to produce an output signal indicative of whether a write precedence mode or a read precedence mode of operation of said programmable integrated circuit logic array device is desired; and control means responsive to read and write request signals produced by said external apparatus for enabling said bus port to output data from said device in response to a read request signal unless said output signal indicates that said write precedence mode is desired and a write request signal is also present, and for enabling said bus port to input data to said device in response to a write request signal unless said output signal indicates that said read precedence mode is desired and a read request signal is also present.

* * * * *